(12) United States Patent
Tsutsui et al.

(10) Patent No.: US 9,409,397 B2
(45) Date of Patent: Aug. 9, 2016

(54) PROCESS FOR PRODUCING A LIQUID EJECTION HEAD

(71) Applicant: CANON KABUSHIKI KAISHA, Tokyo (JP)

(72) Inventors: Satoshi Tsutsui, Yokohama (JP); Etsuko Sawada, Tokyo (JP); Ken Ikegame, Ebina (JP); Hiroaki Mihara, Machida (JP); Yohei Hamade, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 344 days.

(21) Appl. No.: 14/231,980

(22) Filed: Apr. 1, 2014

(65) Prior Publication Data

US 2014/0311661 A1  Oct. 23, 2014

(30) Foreign Application Priority Data

Apr. 23, 2013 (JP) ................................ 2013-090363

(51) Int. Cl.
*B41J 2/05* (2006.01)
*B41J 2/16* (2006.01)
*G03F 7/038* (2006.01)

(52) U.S. Cl.
CPC .............. *B41J 2/1623* (2013.01); *B41J 2/1603* (2013.01); *B41J 2/1606* (2013.01); *B41J 2/1631* (2013.01);
(Continued)

(58) Field of Classification Search
CPC ...... B41J 2/1606; B41J 2/1623; B41J 2/1637; B41J 2/1631; B41J 2/1639; G03F 7/038
USPC ............................................ 430/320; 347/47
See application file for complete search history.

(56) References Cited

U.S. PATENT DOCUMENTS 8,741,549 B2  6/2014  Ishizuka
8,957,151 B2  2/2015  Tsutsui et al.
(Continued)

FOREIGN PATENT DOCUMENTS

JP    2004-75739 A   3/2004
WO   2013/157659 A1  10/2013

OTHER PUBLICATIONS

Tsutsui et al., U.S. Appl. No. 14/506,877, filed Oct. 6, 2014.
(Continued)

*Primary Examiner* — John A McPherson
(74) *Attorney, Agent, or Firm* — Fitzpatrick, Cella, Harper & Scinto

(57) ABSTRACT

A process for producing a liquid ejection head having a substrate and an ejection orifice forming member having an ejection orifice for ejecting liquid, including forming, on the substrate, a photocationically polymerizable resin layer which includes a photocationically polymerizable resin material and becomes the ejection orifice forming member; laminating, on the uncured photocationically polymerizable resin layer, a layer containing a condensation product of a hydrolyzable silane compound having a cationically polymerizable epoxy group and a hydrolyzable silane compound having a fluorine-containing group; laminating a water-repellent layer including a hydrolyzable silane compound having a perfluoropolyether group on the condensation-product-containing layer; subjecting the photocationically polymerizable resin layer, condensation-product-containing layer, and water-repellent layer to pattern exposure; collectively curing exposed portions of the photocationically polymerizable resin layer, condensation-product-containing layer, and water-repellent layer; and removing non-exposed portions of the photocationically polymerizable resin layer, condensation-product-containing layer, and water-repellent layer to form the ejection orifice.

11 Claims, 2 Drawing Sheets

(52) U.S. Cl.
CPC .............. *B41J 2/1637* (2013.01); *B41J 2/1639* (2013.01); *B41J 2/1645* (2013.01); *G03F 7/038* (2013.01); *Y10T 156/1043* (2015.01)

(56) References Cited

U.S. PATENT DOCUMENTS

| | | | |
|---|---|---|---|
| 9,029,074 B2 | 5/2015 | Hamade et al. | |
| 9,150,697 B2 | 10/2015 | Sawada et al. | |
| 2006/0132539 A1* | 6/2006 | Hino | B41J 2/1433 347/47 |
| 2007/0085877 A1* | 4/2007 | Ohkuma | B41J 2/1603 347/45 |
| 2008/0170101 A1* | 7/2008 | Kwon | B41J 2/1603 347/45 |
| 2011/0050785 A1* | 3/2011 | Sawada | B41J 2/1603 347/20 |
| 2012/0154487 A1* | 6/2012 | Sambhy | B41J 2/1606 347/45 |
| 2013/0216958 A1 | 8/2013 | Tsutsui et al. | |
| 2014/0272725 A1 | 9/2014 | Hamade et al. | |
| 2014/0309329 A1 | 10/2014 | Sawada et al. | |

OTHER PUBLICATIONS

Sawada et al., U.S. Appl. No. 15/002,798, filed Jan. 21, 2016.
Sawada et al., U.S. Appl. No. 15/005,268, filed Jan. 25, 2016.

* cited by examiner

PROCESS FOR PRODUCING A LIQUID EJECTION HEAD

BACKGROUND OF THE INVENTION

1. Field of the Invention

The present invention relates to a process for producing a liquid ejection head.

2. Description of the Related Art

In an ink jet recording head which is an embodiment of a liquid ejection head, the surface characteristics of an ejection orifice are important for achieving excellent ejection performance. Ink puddle remaining in the vicinity of an ejection orifice may cause deviation in flight direction of an ink drop or may cause reduction in the ejection speed of an ink drop due to a load applied to the ejected ink drop in some cases. Examples of a method for ejecting ink with good precision, which can solve these problems, include a water repellent treatment to the vicinity of an ejection orifice. In application of a water repellent treatment, for example, a silicone based compound or a fluorine compound may be used as a water repellent material. Examples of the fluorine compound include a perfluoroalkyl-group-containing compound, a perfluoropolyether-group-containing compound. A method using a perfluoropolyether-group-containing compound which has more fluorine atoms in a molecule with less surface energy than a perfluoroalkyl-group-containing compound has recently been used in view of the achievement of higher water repellency.

Alternatively, the ink remaining on the surface may be wiped out with a rubber blade or the like at fixed intervals in order to maintain the state of the surface of the ejection orifice of an ink jet recording head in some cases. For a water repellent treatment having high durability to wiping, an adhesion layer is arranged between an ejection orifice forming member and a water-repellent layer at the outermost surface so as to make an ink jet recording head having a water repellent film with high durability, according to a method disclosed in Japanese Patent Application Laid-Open No. 2004-75739 (Patent Literature 1).

SUMMARY OF THE INVENTION

A process for producing a liquid ejection head according to the present invention is a process for producing a liquid ejection head including a substrate and an ejection orifice forming member having an ejection orifice for ejecting liquid, which includes the steps of:

1) forming, on the substrate, a photocationically polymerizable resin layer which includes a photocationically polymerizable resin material and becomes the ejection orifice forming member 2) laminating, on the uncured photocationically polymerizable resin layer, a layer containing a condensation product obtained by condensation of a hydrolyzable silane compound having a cationically polymerizable epoxy group and a hydrolyzable silane compound having a fluorine-containing group 3) laminating a water-repellent layer including a hydrolyzable silane compound having a perfluoropolyether group on the condensation-product-containing layer 4) subjecting the photocationically polymerizable resin layer, the condensation-product-containing layer, and the water-repellent layer to pattern exposure 5) collectively curing exposed portions of the photocationically polymerizable resin layer, the condensation-product-containing layer, and the water-repellent layer 6) removing non-exposed portions of the photocationically polymerizable resin layer, the condensation-product-containing layer, and the water-repellent layer to form the ejection orifice Further features of the present invention will become apparent from the following description of exemplary embodiments with reference to the attached drawings.

DESCRIPTION OF THE EMBODIMENTS

Figure 1:
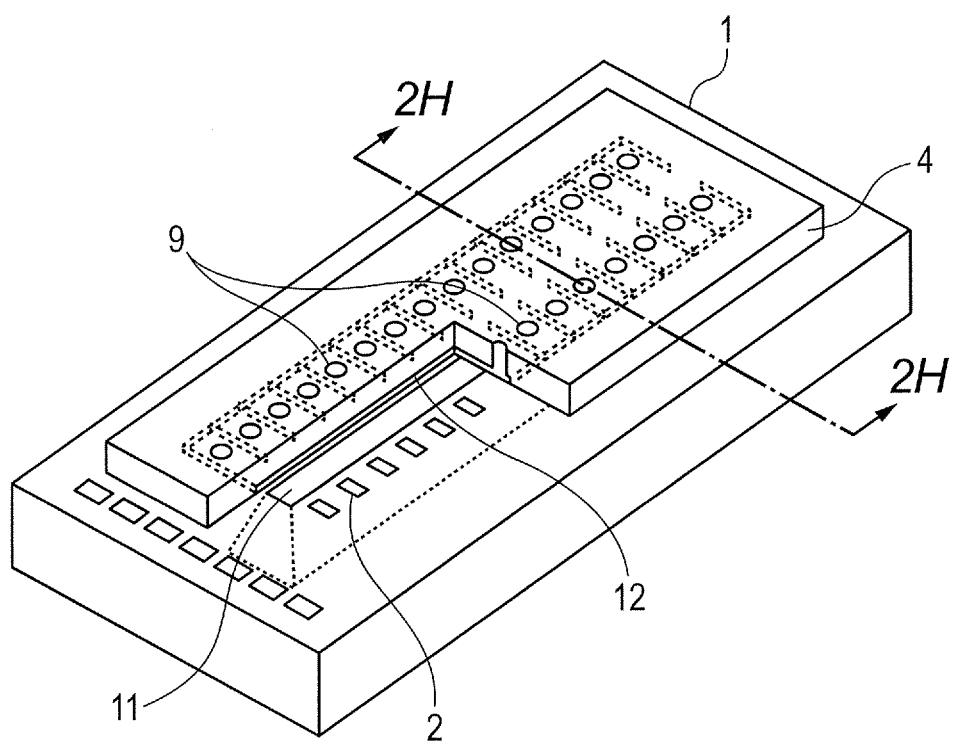
FIG. 1 is a schematic perspective view illustrating an example an ink jet recording head produced by the method of the present invention.

Preferred embodiments of the present invention will now be described in detail in accordance with the accompanying drawings.

In application of the method disclosed in Patent Literature 1 to the process for producing a liquid ejection head in which an ejection orifice forming member is formed by photolithography, the shape deformation of the ejection orifice may be caused. In Patent Literature 1, examples of the material for the adhesive layer include a silane compound having an amino group. In the case of using the silane compound having an amino group as a material for the adhesive layer and using a cationically polymerizable negative-type photosensitive resin as a material for the ejection orifice forming member, the curing reaction caused by cations generated from a photocationic polymerization initiator during exposure may be inhibited in some cases. In Patent Literature 1, an amino group is used for improving adhesion. Thus, in the case of having no amino group in Patent Literature 1, the durability to frequent wiping is insufficient. In the case of using a perfluoropolyether group-containing compound as a material of a water-repellent film for further high water repellency, the durability to wiping is further reduced, so that sufficient adhesion cannot be ensured.

An object of the present invention is to provide a process for producing a liquid ejection head capable of performing highly accurate patterning and having high liquid repellency and high durability to wiping.

A process for producing a liquid ejection head according to the present invention is a process for producing a liquid ejection head including a substrate and an ejection orifice forming member having an ejection orifice for ejecting liquid, which includes the steps of: 1) forming, on the substrate, a photocationically polymerizable resin layer which includes a photocationically polymerizable resin material and becomes the ejection orifice forming member; 2) laminating, on the uncured photocationically polymerizable resin layer, a layer containing a condensation product—obtained by condensation of a hydrolyzable silane compound having a cationicaily polymerizable epoxy group and a hydrolyzable silane compound having a fluorine-containing group; 3) laminating a water-repellent layer which includes a hydrolyzable silane compound having a perfluoropolyether group on the condensation-product-containing layer; 4) subjecting the photocationically polymerizable resin layer, the condensation-product-containing layer, and the water-repellent layer to pattern exposure; 5) collectively curing exposed portions of the photocationically polymerizable resin layer, the condensationproduct-containing layer, and the water-repellent layer; and 6) removing non-exposed portions of the photocationically polymerizable resin layer, the condensation-product-containing layer, and the water-repellent layer to form the ejection orifice.

In the process of the present invention, a photocationically polymerizable resin layer which includes a photocationically polymerizable resin material, a layer containing a condensation product-obtained by condensation of a hydrolyzable silane compound having a cationically polymerizable epoxy group and a hydrolyzable silane compound having a fluorine-containing group, and a water-repellent layer which includes a hydrolyzable silane compound having a perfluoropolyether group are laminated in this order to be collectively cured. On this occasion, an ether bond is formed between the photocationically polymerizable resin layer 4 and the condensation-product-containing layer 5 by the reaction of the cationically polymerizable epoxy group. Furthermore, a siloxane bond is formed between the condensation-product-containing layer 5 and the water-repellent layer 6 by the dehydration condensation reaction of silanol groups. The adhesion between the layers is thus improved, so that a liquid ejection head having high durability to wiping can be produced. Since a hydrolyzable silane compound having a perfluoropolyether group is used as a water-repellent material, a liquid ejection head having high liquid repellency can be produced. The process of the present invention uses no silane compound having an amino group, so that the curing reaction is not inhibited to enable highly accurate patterning.

Embodiments of the present invention are described in the following with reference to drawings. The present invention, however, is not limited thereto. In the following description, the same symbols are given to the components having the same function in drawings the description of which may be omitted.

FIG. 1 is a schematic perspective view of an ink jet recording head, which is an embodiment of a liquid ejection head produced by the method of the present invention. The ink jet recording head illustrated in FIG. 1 includes a substrate 1 having a plurality of energy generating elements 2. The substrate 1 includes a flow path 12 for holding ink and an ejection orifice forming member 4 which communicates with the flow path 12 and forms an ejection orifice 9 for ejecting ink. The surface of the ejection orifice forming member 4 in contact with the outside includes a condensation-product-containing layer and a water-repellent layer which are not illustrated in the drawing. The substrate 1 includes a supply port 11 which passes through the substrate 1 and supplies ink to the flow path 12. FIG. 2A to FIG. 2H are schematic cross-sectional views taken along the line 2H-2H illustrating the respective steps for producing an ink jet recording head illustrated in FIG. 1. The respective steps of the present invention are described in detail in the following with reference to FIG. 2A to FIG. 2H.

First, a positive type photosensitive resin layer which contains a positive type photosensitive resin as a mold material of a flow path is formed on the substrate 1 having energy generating elements 2. The positive type photosensitive resin is not specifically limited. A material having a low absorbance for light for use in exposure of a photocationically polymerizable resin layer 4 can be used to prevent reduction in patterning performance due to sensitization during exposure of the photocationically polymerizable resin layer 4 as described later. In the case of using ultraviolet rays as the light, for example, polymethyl isopropenyl ketone or the like which can be exposed with deep UV light may be used as the positive type photosensitive resin. The positive type photosensitive resin layer may be formed by, for example, dissolving the positive type photosensitive resin in a proper solvent, applying the solution by spin coating, followed by prebaking. Since the thickness of the positive type photosensitive resin layer corresponds to the height of the flow path, the thickness may be properly determined by the design of liquid ejection head, for example, in the range of 14 to 22 μm.

Figure 2A:
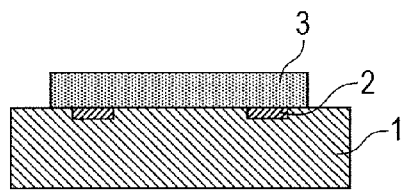
FIGS. 2A, 2B, 2C, 2D, 2E, 2F, 2G and 2H are cross-sectional views illustrating respective steps of the process for producing an ink jet recording head according to the present invention.

Subsequently, a mold material 3 is formed by patterning the positive type photosensitive resin layer (FIG. 2A). Examples of the method for patterning the positive type photosensitive resin layer include pattern exposure which allows the positive type photosensitive resin layer to be irradiated with active energy rays capable of sensitizing the positive type photosensitive resin through a mask. Development is then performed using a solvent or the like capable of dissolving the exposed portion of the positive type photosensitive resin layer. After a rinsing treatment, the mold material 3 can be formed.

Figure 2B:
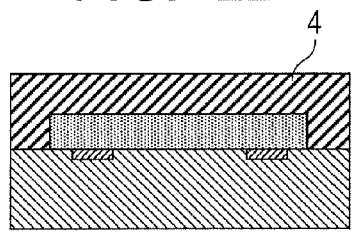

Subsequently, the photocationically polymerizable resin layer 4 which includes a photocationically polymerizable resin material and a photocationic polymerization initiator is formed on the mold material 3 and the substrate 1 (FIG. 2B). Examples of the photocationically polymerizable resin material include an epoxy compound, a vinyl ether compound, and an oxetane compound. Among them, an epoxy compound is preferred as photocationically polymerizable resin material, in view of having high mechanical strength and high adhesion with a substrate. Examples of the epoxy compound include a bisphenol A type epoxy resin and a novolac type epoxy resin. Examples of a commercial product include "EHPE-3150" (trade name, made by Daicel Corporation), "Celloxide 2021" (trade name, made by Daicel Corporation), "GT-300 series" (trade name, made by Daicel Corporation), "GT-400 series" (trade name, made by Daicel Corporation), "157S70" (trade name, made by Japan Epoxy Resins Co., Ltd.), "EPICLON N-865" (trade name, made by DIC Corporation), and "SU8" (trade name, made by Nippon Kayaku Co., Ltd). The epoxy compound has an epoxy equivalent of preferably 2,000 or less, and more preferably 1,000 or less. With an epoxy equivalent of 2,000 or less, the curing reaction causes no reduction in crosslink density, so that the reduction in glass transition temperature and adhesion of the cured product can be prevented. The lower limit of the epoxy equivalent is not specifically limited, and can be, for example, 50 or more. The epoxy equivalent is a value measured in accordance with JISK-7236.

As the photocationic polymerization initiator, an onium salt such as an ionic sulfonium salt or an iodonium salt can be used. However, in view of the high cationic polymerization activity, an onium salt having, as an anion, phosphorus based $PF_6$ or antimony based $SbF_6$ is preferred. Examples of a commercial product include "SP-172" (trade name, made by ADEKA Corporation). The photocationically polymerizable resin layer 4 may be formed by, for example, dissolving the material of the photocationically polymerizable resin layer 4 in a proper solvent so as to form a solution, and applying the solution to the mold material 3 and the substrate 1 by spin coating. The solvent for use is selected from solvents in which the mold material 3 is not dissolved. The thickness of the photocationically polymerizable resin layer 4 is not specifically limited, and can be 20 to 45 μm on the mold material 3, for example.

Figure 2C:
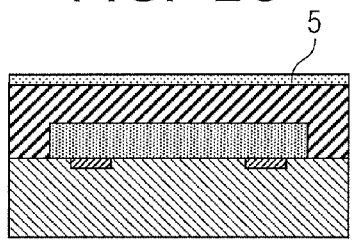

Subsequently, a condensation-product-containing layer 5 produced by condensation of a hydrolyzable silane compound having a cationically polymerizable epoxy group and a hydrolyzable silane compound having a fluorine-containing group is formed on the uncured photocationically polymerizable resin layer 4 (FIG. 2C). In the present invention, the condensation-product-containing layer 5 has a function for enhancing the adhesion between the photocationically polymerizable resin layer 4 and the below-described water-repellent layer 6. The condensation-product-containing layer 5 may be formed by spin coating, slit coating or the like. The thickness of the condensation-product-containing layer 5 is not specifically limited and can be, for example, 0.1 to 1 µm.

The hydrolyzable silane compound having a cationically polymerizable epoxy group can be a compound represented by the following formula (1), in view of versatility:

(In formula (1), $R_C$ represents a non-hydrolyzable substituent having a cationically polymerizable epoxy group, X represents a hydrolyzable substituent, Y represents a non-hydrolyzable substituent, and b is an integer of 0 to 2.). Examples of $R_C$ in the formula (1) include a glycidoxypropyl group and an epoxycyclohexylethyl group. Examples of X include an alkoxy group such as a methoxy group and an ethoxy group, a halogen atom, and a hydrogen atom. Examples of Y include an alkyl group such as a methyl group and ethyl group, and a phenyl group. Preferably b is 0 or 1, and more preferably 0. Specific examples of the compound represented by the formula (1) include glycidoxypropyl trimethoxy silane, glycidoxypropyl triethoxy silane, epoxycyclohexylethyl trimethoxy silane, and epoxycyclohexylethyl triethoxy silane. One of these compounds may be used alone, or two or more of these compounds may be used in combination.

In the case where a condensation product produced by condensation only of a hydrolyzable silane compound having a cationically polymerizable epoxy group is applied to the uncured photocationically polymerizable resin layer 4, the condensation product sinks into the uncured photocationically polymerizable resin layer 4, without enhancing adhesion. Furthermore, the uncured photocationically polymerizable resin layer 4 and the condensation-product-containing layer produced by condensation only of a hydrolyzable silane compound having a cationically polymerizable epoxy group dissolve into each other, producing a non-smooth surface in some cases. In the present invention, a condensation product produced by condensation of hydrolyzable silane compounds which include at least a hydrolyzable silane compound having a cationically polymerizable epoxy group and a hydrolyzable silane compound having a fluorine-containing group is therefore used. The presence of the hydrolyzable silane compound having a fluorine-containing group with low surface tension prevents the condensation product from sinking. Consequently the condensation product is retained on the surface of the uncured photocationically polymerizable resin layer 4, producing a smooth surface. The presence of the fluorine-containing group allows the components having a fluorine-containing group to be oriented on the air interface side (water-repellent layer side) and the components having a cationically polymerizable epoxy group to be oriented on the side of the uncured photocationically polymerizable resin layer 4.

The hydrolyzable silane compound having a fluorine-containing group is preferably a compound represented by the following formula (2), in view of preventing the condensation product from sinking:

(In the formula (2), $R_f$ represents a non-hydrolyzable substituent having a fluorine atom bonded to a carbon atom, X represents a hydrolyzable substituent, Y represents a non-hydrolyzable substituent, and b is an integer of 0 to 2.).

In the formula (2), $R_f$ can be a group represented by $CF_3(CF_2)_n$—Z—, wherein Z represents a bivalent organic group, preferably a bivalent organic group having 10 or less carbon atoms, more preferably a bivalent alkylene group or alkyleneoxy group having 6 or less carbon atoms. Specific examples of Z include a methylene group, an ethylene group, a propylene group, a butylene group, a methyleneoxy group, an ethyleneoxy group, a propyleneoxy group, and a butyleneoxy group. Among them, an ethylene group is particularly preferred as Z. Incidentally, n can be an integer of 0 to 5. The reason is that a long-chain perfluoroalkyl-group ($C_8$ or more)-containing compound such as persistent perfluorooctane sulfonate or perfluorooctanate, which is hardly decomposable, is a concern as a substance having an influence on environment and human health. $R_f$ can have 3 to 35 fluorine atoms bonded to carbon atoms.

In the formula (2), examples of X include an alkoxy group such as a methoxy group and an ethoxy group, a halogen atom, and a hydrogen atom. Examples of Y include an alkyl group such as a methyl group and an ethyl group and a phenyl group. Preferably b is 0 or 1, and more preferably 0.

The compound represented by the formula (2) can be a compound represented by the following formula (3):

(In the formula (3), X represents a hydrolyzable substituent, Z represents a bivalent organic group, and n is an integer of 0 to 5.) Specific examples of the compound include tridecafluoro-1,1,2,2-tetrahydrooctyl triethoxy silane, tridecafluoro-1,1,2,2-tetrahydrooctyl trimethoxy silane, nonafluoro-1,1,2,2-tetrahydrohexyl triethoxy silane, 3,3,3-trifluoropropyl trimethoxy silane, and pentafluorophenyl triethoxy silane. One of these compounds may be used alone, or two or more of these compounds may be used in combination.

In addition to the hydrolyzable silane compound having a cationically polymerizable epoxy group and the hydrolyzable silane compound having a fluorine-containing group, the hydrolyzable silane compounds for use in synthesis of the condensation product in the present invention can further include a hydrolyzable silane compound represented by the following formula (4):

(In the formula (4), $R_d$ represents an alkyl group, X represents a hydrolyzable substituent, and a is an integer of 1 to 3.). The presence of the alkyl-substituted hydrolyzable silane compound represented by the formula (4) increases the freedom degree of the condensation product. The orientation of the components having a fluorine-containing group to the air interface side (water-repellent layer side) and the orientation of the components having a cationically polymerizable epoxy group to the side of the uncured photocationically polymerizable resin layer 4 are further facilitated thereby. Examples of $R_d$ in the formula (4) include a methyl group, an ethyl group, a propyl group, a butyl group, a hexyl group, a phenyl group, and a naphthyl group. Examples of X include an alkoxy group such as a methoxy group, an ethoxy group, and a propoxy group, a halogen atom, and a hydrogen atom. Incidentally, a can be 1 or 2. Specific examples of the compound represented by the formula (4) include methyl trimethoxy silane, methyl triethoxy silane, methyl tripropoxy silane, ethyl trimethoxy silane, ethyl triethoxy silane, ethyl tripropoxy silane, propyl trimethoxy silane, propyl triethoxy silane, propyl tripropoxy silane, dimethyl dimethoxy silane, and dimethyl diethoxy silane. One of these compounds may be used alone, or two or more of these compounds may be used in combination.

The compounding ratio of the respective hydrolyzable silane compounds may be properly determined corresponding to the type of usage. The proportion of the number of moles of the hydrolyzable silane compound having a fluorine-containing group with respect to the total number of moles of the hydrolyzable silane compounds for use in the above-mentioned step 2) is preferably 0.5 to 20 mol %, and more preferably 1 to 15 mol %. The proportion in these ranges prevents the sinking into the uncured photocationically polymerizable resin layer 4, producing a uniform layer. In view of improvement in adhesion with the photocationically polymerizable resin layer 4, the proportion of the number of moles of a hydrolyzable silane compound having a cationically polymerizable epoxy group with respect to the total number of moles of the hydrolyzable silane compounds for use in the above-mentioned step 2) is preferably 10 to 90 mol %, and more preferably 30 to 70 mol %.

The condensation product can be synthesized by hydrolysis and polycondensation reaction of the hydrolyzable silane compounds in the presence of water. The degree of progress of the polycondensation reaction is represented by the condensation degree as an index. The condensation degree can be defined as a proportion of the number of the condensed functional groups (the number of functional groups involved in formation of Si—O—Si siloxane bonds) in the total number of condensable functional groups (e.g., an alkoxy group and a silanol group). In practice, it can be estimated by 29Si—NMR measurement. For example, the condensation degree of a trifunctional hydrolyzable silane compound is calculated by the following expression.

T0 form: Si atom not bonded to other hydrolyzable silane compounds
T1 form: Si atom bonded to one hydrolyzable silane compound through oxygen
T2 form: Si atom bonded to two hydrolyzable silane compounds through oxygen
T3 form: Si atom bonded to three hydrolyzable silane compounds through oxygen Condensation degree (%)={($T1+2 \times T2+3 \times T3$)×100}/ {3×($T0+T1+T2+T3$)}

The condensation degree differs depending on the type of hydrolyzable silane compound and synthesis conditions, being preferably 20 to 80%, more preferably 30 to 70%, and furthermore preferably 40 to 60% in view of compatibility with the resin and coatability.

Figure 2D:
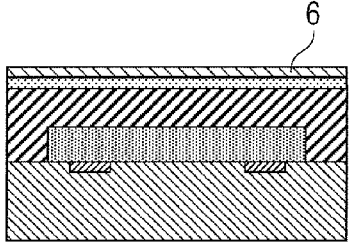

Subsequently, the water-repellent layer 6 is laminated on the condensation-product-containing layer 5 (FIG. 2D). The water-repellent layer 6 includes a hydrolyzable silane compound having a perfluoropolyether group as a water repellent material in view of achieving high water repellency. Examples of the perfluoropolyether group include a group represented by the following formula (5):

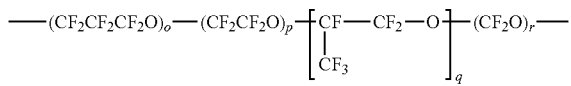
(5)

(In the formula (5), o, p, q and r represent 0 or an integer of 1 or more, and at least one of o, p, q and r is an integer of 1 or more.). The molecular weight of the perfluoropolyether group is preferably 500 to 10,000, and more preferably 1,000 to 5,000. With a molecular weight of 500 or more, sufficient liquid repellency can be obtained. With a molecular weight of 10,000 or less, sufficient solubility to a solvent can be obtained. The molecular weight of the perfluoropolyether group in the formula (5) is the gross molecular weight of the portions represented by the respective repeating units. The molecular weight of the perfluoropolyether group is a value measured by gel permeation chromatography (GPC).

The hydrolyzable silane compound having a perflouoropolyether group reacts with a condensation-product-containing layer to form a bond. The hydrolyzable silane compound having a perfluoropolyether group can be at least one of the compounds represented by the following formulae (6), (7), (8) and (9), in view of water repellency:

(6)

(In the formula (6), Rp represents a perfluoropolyether group, A represents an organic group having 1 to 12 carbon atoms, X represents a hydrolyzable substituent, Y represents a non-hydrolyzable substituent, and a is an integer of 1 to 3.)

(7)

(In the formula (7), Rp, A, X, Y and a are as defined in the formula (6).)

(8)

(In the formula (8), Z represents a hydrogen atom or an alkyl group, $Q^1$ represents a bivalent linking group, and m is an integer of 1 to 4. Rp, A, X, Y and a are as defined in the formula (6).)

(9)

(In the formula (9), n is 1 or 2. $Q^2$ represents a bivalent linking group for n=1, and a trivalent linking group for n=2. Rp, A, X, Y and a are as defined in the formula (6).)

In the formulae (6) to (9), Rp may be the perfluoropolyether group as described above. Examples of X include a halogen atom, an alkoxy group, an amino group, and a hydrogen atom. Among them, an alkoxy group such as a methoxy group and an ethoxy group is preferred, since groups eliminated by hydrolysis do not inhibit the cationic polymerization reaction to allow of easy reaction control. Examples of Y include an alkyl group having 1 to 20 carbons and a phenyl group. Examples of A include a methylene group, an ethylene group, and a propylene group. Examples of the alkyl group as Z include a methyl group, an ethyl group, and a propyl group. Examples of $Q^1$ and $Q^2$ include a carbon atom and a nitrogen atom. Incidentally, a is preferably 2 or 3, and m is preferably an integer of 1 to 3.

Specific examples of the hydrolyzable silane compound having a perfluoropolyether group include compounds represented by the following formulae (10) to (13).

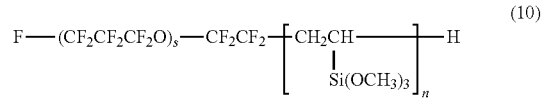
(10)

(In the formula (10), s is an integer of 3 to 60, and n is an integer of 1 to 3.)

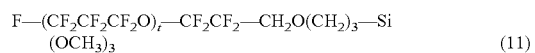
(11)

(In the formula (11), t is an integer of 3 to 60.)

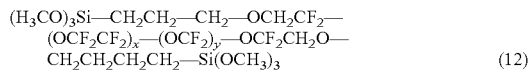
(12)

(In the formula (12), x is an integer of 20 or less, and y is an integer of 30 or less.)

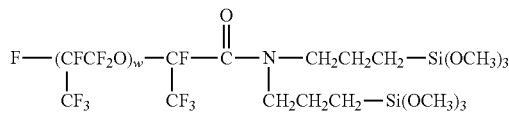
(13)

(In the formula (13), w is an integer of 3 to 60.).

One of these compounds may be used alone, or two or more of these compounds may be used in combination.

The water-repellent layer 6 may be formed by a method such as spin coating, slit coating, roll coating, dip coating, and vacuum deposition. When applying a solution of a hydrolyzable silane compound having a perfluoropolyether group diluted with a solvent, the concentration of the compound is properly selected corresponding to the coating method, the intended application, and the material of the condensation-product-containing layer 5. The concentration of the compound is preferably 0.01 to 1.0 mass %, and more preferably 0.05 to 0.5 mass %. With a concentration of the compound within these ranges, sufficient water repellency, durability, and uniform water repellency over the entire surface of a coating film can be obtained. Examples of the solvent for diluting the hydrolyzable silane compound having a perfluoropolyether group include hydrofluorocarbon, perfluorocarbon, hydrofluoroether, hydrofluoropolyether, and perfluoropolyether. One of these solvents may be used alone, or two or more of these solvents may be used in combination. The thickness of the water-repellent layer 6 can be 1 to 20 nm.

Figure 2E:
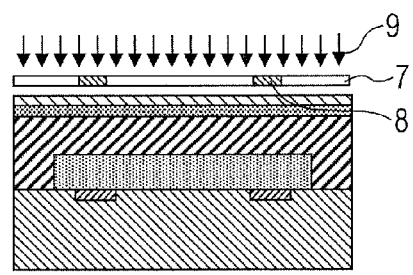

Subsequently, the cure region of the photocationically polymerizable resin layer 4, the condensation-product-containing layer 5, and the water-repellent layer 6 is irradiated with light 8 from above the water-repellent layer 6 through a mask 7 (FIG. 2E). Ultraviolet rays may be used as the light 8. For example, the i-line may be used as the ultraviolet rays. In the present embodiment, in the region irradiated with the light 8, the acid generated from a photocationic polymerization initiator present in the photocationically polymerizable resin layer 4 diffuses into the condensation-product-containing layer 5 and the water-repellent layer 6. Consequently, ether bonds are formed in the photocationically polymerizable resin layer 4 and the condensation-product-containing layer 5 by the reaction of the cationically polymerizable epoxy group. In addition, in the condensation-product-containing layer 5 and the water-repellent layer 6, silanol groups are formed by hydrolysis involving moisture in the air. Furthermore, the presence of the acid facilitates the dehydration condensation reaction, so that siloxane bonds are formed in the condensation-product-containing layer 5 and the water-repellent layer 6. In the region irradiated with the light 8, the three layers of the photocationically polymerizable resin layer 4, the condensation-product-containing layer 5, and the water-repellent layer 6 can be thus collectively cured, securing the adhesion.

Figure 2F:
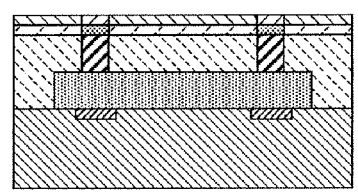

Subsequently, heat treatment is performed in order to facilitate the collective curing of the photocationicaily polymerizable resin layer 4, the condensation-product-containing layer 5, and the water-repellent layer 6 (FIG. 2F). The heat treatment facilitates the reaction in the exposure part and imparts the durability for the subsequent development step. The heat treatment can be performed, for example, with a hot plate. The temperature of the heat treatment is not specifically limited, and can be, for example, 70 to 100° C. The time period for the heat treatment is not specifically limited, and can be, for example, 3 to 5 minutes.

Figure 2G:
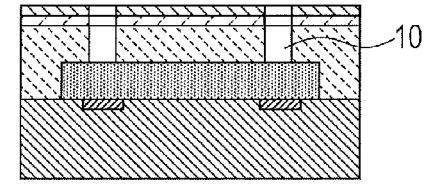

Subsequently, the non-exposed portions of the photocationically polymerizable resin layer 4, the condensation-product-containing layer 5, and the water-repellent layer 6 are removed by development so as to form the ejection orifice 10 (FIG. 2G). Since the water-repellent layer 6 is thinly formed, the water repellent layer 6 on the non-exposed portions of the photocationically polymerizable resin layer 4 and the condensation-product-containing layer 5 can be removed together with the non-exposed portions during development. The three layers of the photocationically polymerizable resin layer 4, the condensation-product-containing layer 5, and the water-repellent layer 6 can be thus collectively patterned. The developing solution for use in the development is not specifically limited, so long as the photocationically polymerizable resin layer 4 in the non-exposed portion can be developed by the solution. Examples of the developing solution for use include a mixed liquid of methyl isobutyl ketone (MIBK) and xylene. After development, a rinse treatment may be further performed. Examples of the solution for use in the rinse treatment include a compound liquid of MIBK and hydrofluoroether.

Figure 2H:
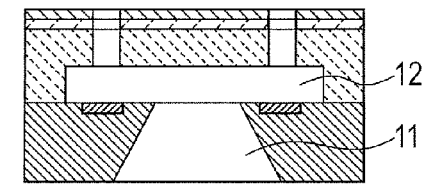

Subsequently, a supply port 11 is formed on the substrate 1. The mold material 3 is then removed to form a flow path 12 (FIG. 2H). In the case of a substrate 1 made of silicon, the supply port 11 may be formed, for example, by anisotropic etching with an alkali solution. The flow path 12 may be formed, for example, by immersing the substrate 1 in a solvent capable of dissolving the mold material 3 to remove the mold material 3. The mold material 3 may be exposed to active energy rays for photosensitization on an as needed basis, so that the solubility of the mold material 3 can be enhanced. Electrical connection is then provided for driving the energy generating elements 2. In addition, an ink supply member for supplying ink is connected, so that an ink jet recording head can be made.

EXAMPLES

Examples of the present invention are described in the following, but are not intended to limit the scope of the present invention. Evaluation methods of the ink jet recording head in Examples are described in the following.

Measurement of Dynamic Retreat Contact Angle

The dynamic retreat contact angle θr for pure water of the water repellent layer of a produced ink jet recording head was measured with an automatic contact angle meter (product name: CA-W, made by Kyowa Interface Science Co., Ltd.) for the evaluation of the initial water repellency. In addition, while spraying ink onto the surface of a water repellent layer of an ink jet recording head, the ink was repeatedly wiped off with a blade of hydrogenated nitrile rubber (HNBR rubber) 2,000 times, and then θr for pure water was evaluated for the evaluation of durability to wiping. In Comparative Example 6, the evaluation was performed for a mixed layer.

Coatability

The coatability was evaluated by visual observation of the surface conditions after forming of the water-repellent layer. The evaluation criteria of the coatability are described in the following. In Comparative Example 6, the evaluation was performed for a mixed layer.

OK: Water-repellent layer has a smooth surface.
NG: Water-repellent layer has an uneven surface.

Example 1

An ink jet recording head was made by performing the steps illustrated in FIG. 2A to FIG. 2H. First, polymethyl isopropenyl ketone was dissolved in cyclohexanone to prepare a solution, which was then applied to a substrate 1 having an energy generating element 2 by spin coating, followed by prebaking at 120° C., thereby forming a positive type photosensitive resin layer having a thickness of 14 μm. Subsequently, the positive type photosensitive resin layer was irradiated with deep UV light through a mask to conduct pattern exposure. The exposed portion of the positive type photosensitive resin layer was developed with methyl isobutyl ketone (MIBK), and rinsed with isopropyl alcohol (IPA) to form a mold material 3 (FIG. 2A). Subsequently, 100 mass parts of a photocationically polymerizabie resin material "EHPE-3150" (trade name, made by Daicel Corporation, epoxy equivalent: 180) and 6 mass parts of a photocationic polymerization initiator "SP-172" (trade name, made by ADEKA Corporation) were dissolved in xylene. The solution was applied to the mold material 3 and the substrate 1, so that a photocationically polymerizable resin layer 4 having a thickness of 25 μm was formed on the mold material 3 (FIG. 2B).

Subsequently, a condensation product produced by condensation of a hydrolyzable silane compound having a cationically polymerizable epoxy group and a hydrolyzable silane compound having a fluorine-containing group was synthesized by the following procedure. Water and ethanol were added to 7.66 g of tridecafluoro-1,1,2,2-tetrahydrooctyl triethoxy silane and 27.84 g of γ-glycidoxypropyl triethoxy silane. The mixture was stirred at room temperature and refluxed for 24 hours to produce a condensation product. The produced condensation product had a condensation degree of 55%. The condensation product was diluted with 2-butanol/ethanol so as to have a solid content of 7 mass %. The dilution of the condensation product was applied to the uncured photocationically polymerizable resin layer 4 by slit coating, so that a condensation-product-containing layer 5 having a thickness of 0.5 μm was formed (FIG. 2C).

Subsequently, a compound represented by the formula (10) (molecular weight of perfluoropolyether group: 4,000) was diluted with hydrofluoroether, such that the concentration of the compound is 0.2 mass %. The solution was applied to the condensation-product-containing layer 5 by spin coating, so that a water-repellent layer 6 having a thickness of 0.05 μm was formed (FIG. 2D). Subsequently, the cure region of the photocationically polymerizable resin layer 4, the condensation-product-containing layer 5, and the water-repellent layer 6 was irradiated with the i-line 9 from above the water-repellent layer 6 through a mask 7 (FIG. 2E). Subsequently, a heat treatment was performed with a hotplate at 90° C. for 4 minutes (FIG. 2F). Subsequently, development was performed with a mixed liquid of MIBK and xylene. Rinse treatment was then performed with a mixed liquid of MIBK and hydrofluoroether, so that an ejection orifice 10 was formed (FIG. 2G).

Subsequently, the substrate 1 was anisotropically etched with an alkali solution of tetramethylammoniumhydroxide (TMAH) so as to form a supply port 11. The substrate 1 was then immersed in methyl lactate for dissolving and removing the mold material 3, so that a flow path 12 was formed (FIG. 2H). Electrical connection was then provided for driving the energy generating elements 2. In addition, an ink supply member for supplying ink was connected, so that an ink jet recording head was made. The results are shown in Table 1.

Examples 2 to 16

Except that the type and composition of the respective compounds were changed to those described in Table 1, ink jet recording heads were made and evaluated in the same way as in Example 1. The results are shown in Table 1.

Example 17

Except that the photocationically polymerizable resin material was changed to "GT-401" (trade name, made by Daicel Corporation), an ink jet recording head was made and evaluated in the same way as in Example 1. The results are shown in Table 1.

Comparative Example 1

Except that no condensation-product-containing layer was formed, an ink jet recording head was made and evaluated in the same way as in Example 1. The results are shown in Table 1.

Comparative Examples 2 to 5

Except that the type and composition of the respective compounds were changed to those described in Table 1, ink jet recording heads were made and evaluated in the same way as in Example 1. The results are shown in Table 1.

Comparative Example 6

In the step of forming the condensation-product-containing layer 5 and the water-repellent layer 6, the condensation product synthesized in Example 1 and a compound represented by the formula (10) were mixed and diluted with a mixed solvent of ethanol and hydrofluoroether. The solution was applied to the uncured photocationically polymerizable resin layer 4 by spin coating, so that a mixed layer having a thickness of 0.5 μm was formed. Except for the changes, an ink jet recording head was made and evaluated in the same way as in Example 1. The results are shown in Table 1.

TABLE 1

| | Condensation-product-containing layer | | | | | | | Water-repellant layer Hydrolyzable silane compound having perfluoropolyether group | Initial dynamic retreat contact angle (θr(°)) | Dynamic retreat contact angle (θr(°)) after wiping | Coatability |
|---|---|---|---|---|---|---|---|---|---|---|---|
| | Hydrolyzable silane compound having cationically polymerizable epoxy group | | Hydrolyzable silane compound having flourine-containing group | | Other hydrolyzable silane compound | | Condensation degree of condensation product (%) | | | | |
| | Type | mol | Type | mol | Type | mol | | | | | |
| Example 1 | (d) | 0.1 | (a) | 0.015 | — | — | 55 | Formula (10) | 104 | 88 | OK |
| Example 2 | (d) | 0.05 | (a) | 0.015 | (f) | 0.05 | 56 | Formula (10) | 105 | 89 | OK |
| Example 3 | (d) | 0.05 | (a) | 0.015 | (g) | 0.05 | 51 | Formula (10) | 106 | 90 | OK |
| Example 4 | (d) | 0.1 | (a) | 0.017 | — | — | 58 | Formula (10) | 105 | 90 | OK |
| Example 5 | (d) | 0.05 | (a) | 0.017 | (f) | 0.05 | 59 | Formula (10) | 105 | 91 | OK |
| Example 6 | (d) | 0.05 | (a) | 0.0015 | (f) | 0.05 | 50 | Formula (10) | 104 | 85 | OK |
| Example 7 | (e) | 0.1 | (a) | 0.015 | — | — | 54 | Formula (10) | 101 | 85 | OK |
| Example 8 | (e) | 0.05 | (a) | 0.0075 | (f) | 0.05 | 55 | Formula (10) | 102 | 86 | OK |
| Example 9 | (d) | 0.05 | (a) | 0.0075 | (f) | 0.05 | 55 | Formula (10) | 103 | 87 | OK |
| Example 10 | (d) | 0.05 | (a) | 0.0075 | (f) | 0.05 | 59 | Formula (10) | 100 | 85 | OK |
| Example 11 | (d) | 0.05 | (a) | 0.0075 | (f) | 0.05 | 60 | Formula (10) | 105 | 93 | OK |
| Example 12 | (d) | 0.05 | (c) | 0.015 | (f) | 0.05 | 58 | Formula (10) | 103 | 86 | OK |
| Example 13 | (d) | 0.05 | (c) | 0.015 | (f) | 0.05 | 60 | Formula (10) | 100 | 84 | OK |
| Example 14 | (d) | 0.05 | (a) | 0.015 | (f) | 0.05 | 56 | Formula (11) | 103 | 85 | OK |
| Example 15 | (d) | 0.05 | (a) | 0.015 | (f) | 0.05 | 57 | Formula (12) | 100 | 82 | OK |
| Example 16 | (d) | 0.05 | (a) | 0.015 | (f) | 0.05 | 56 | Formula (13) | 106 | 90 | OK |
| Example 17 | (d) | 0.05 | (a) | 0.015 | (f) | 0.05 | 56 | Formula (10) | 106 | 88 | OK |
| Comparative Example 1 | — | — | — | — | — | — | — | Formula (10) | 100 | 65 | OK |
| Comparative Example 2 | (d) | 0.1 | — | — | — | — | 50 | Formula (10) | 100 | 72 | NG |
| Comparative Example 3 | (d) | 0.05 | — | — | (f) | 0.05 | 51 | Formula (10) | 101 | 70 | NG |
| Comparative Example 4 | — | — | (a) | 0.1 | — | — | 50 | Formula (10) | 100 | 74 | OK |
| Comparative Example 5 | — | — | (a) | 0.015 | (f) | 0.1 | 55 | Formula (10) | 101 | 75 | OK |
| Comparative Example 6 | (d) | 0.1 | (a) | 0.015 | — | — | 55 | Formula (10) | 85 | 64 | NG |

In Table 1, (a) to (g) represent the following comounds, respectively:
(a): tridecafluoro-1,1,2,2-tetrahydrooctyl triethoxy silane
(b): nonafluoro-1,1,2,2-tetrahydrohexyl triethoxy silane
(c): 3,3,3-trifluoropropyl trimethoxy silane
(d): γ-glycidoxypropyl triethoxy silane
(e): β-(3,4-epoxycyclohexyl) ethyl triethoxy silane
(f): methyl triethoxy silane
(g): dimethyl diethoxy silane As shown in Table 1, it was confirmed that the ink jet recording heads made in Examples has excellent coatability and excellent water repellency with a large initial θr. It was also confirmed that the high water repellency is maintained after wiping off. In any conditions for Examples 1 to 17, it was shown that the adhesion between the water-repellent layer and the substrate is improved and the durability to wiping is enhanced. Furthermore, in a printing evaluation using the ink jet recording head, high printing quality was achieved without occurrence of dot misalignment.

In contrast, in any of Comparative Examples 1 to 5, the excellent water repellency with high initial θr was seriously reduced after wiping, so that the insufficient durability to wiping was confirmed. With regard to coatability, since no hydrolyzable silane compound having a fluorine-containing group was used in Comparative Examples 2 and 3, a condensation product of hydrolyzable silane compounds having a cationically polymerizable epoxy group sank into a photocationically polymerizable resin layer. This caused unevenness such as undulation of the surface of the water-repellent layer. In Comparative Example 6, the surface of the mixed layer is not covered with perfluoropolyether groups, so that no uniform water repellency was obtained over the entire surface of the mixed layer, resulting in a low initial θr. Furthermore, due to the presence of the condensation product in the water-repellent layer of the present invention, the adhesion was reduced. Consequently, it was confirmed that the water repellency was substantially reduced after wiping. Furthermore, since the mixed layer was formed of a mixture of the hydrolyzable silane compound having a perfluoropolyether group and a condensed product, no uniform surface of the mixed layer was achieved, causing uneven surface of the mixed layer.

The present invention can provide a process for producing a liquid ejection head capable of performing highly accurate patterning and having high liquid repellency and high durability to wiping.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-090363, filed Apr. 23, 2013, which is hereby incorporated by reference herein in its entirety.

What is claimed is:

1. A process for producing a liquid ejection head comprising a substrate and an ejection orifice forming member having an ejection orifice for ejecting liquid, comprising the steps of:
   1) forming, on the substrate, a photocationically polymerizable resin layer which includes a photocationically polymerizable resin material and becomes the ejection orifice forming member;
   2) laminating, on the uncured photocationically polymerizable resin layer, a layer containing a condensation product obtained by condensation of a hydrolyzable silane compound having a cationically polymerizable epoxy group and a hydrolyzable silane compound having a fluorine-containing group;
   3) laminating a water-repellent layer comprising a hydrolyzable silane compound having a perfluoropolyether group on the condensation-product-containing layer;
   4) subjecting the photocationically polymerizable resin layer, the condensation-product-containing layer, and the water-repellent layer to pattern exposure;
   5) collectively curing exposed portions of the photocationically polymerizable resin layer, the condensation-product-containing layer, and the water-repellent layer; and
   6) removing non-exposed portions of the photocationically polymerizable resin layer, the condensation-product-containing layer, and the water-repellent layer to form the ejection orifice.

2. The process for producing a liquid ejection head according to claim 1, wherein the hydrolyzable silane compound having a perfluoropolyether group is at least one of the compounds represented by the following formulae (6), (7), (8) and (9):

$$\text{F-Rp-A-SiX}_a\text{Y}_{3-a} \tag{6}$$

wherein Rp represents a perfluoropolyether group, A represents an organic group having 1 to 12 carbon atoms, X represents a hydrolyzable substituent, Y represents a non-hydrolyzable substituent, and a is an integer of 1 to 3;

$$\text{Y}_{3-a}\text{X}_a\text{Si-A-Rp-A-SiX}_a\text{Y}_{3-a} \tag{7}$$

wherein Rp, A, X, Y and a are as defined in the formula (6);

(8)

wherein Z represents a hydrogen atom or an alkyl group, $Q^1$ represents a bivalent linking group, m is an integer of 1 to 4, and Rp, A, X, Y and a are as defined in the formula (6);

$$\text{F-Rp-Q}^2\text{(-A-SiX}_a\text{Y}_{3-a})_n \tag{9}$$

wherein n is 1 or 2, $Q^2$ represents a bivalent linking group for n=1, and a trivalent linking group for n=2, Rp, A, X, Y and a are as defined in the formula (6).

3. The process for producing a liquid ejection head according to claim 1, wherein the perfluoropolyether group of the hydrolyzable silane compound having a perfluoropolyether group has a molecular weight of 500 to 10,000.

4. The process for producing a liquid ejection head according to claim 1, wherein the hydrolyzable silane compound having a cationically polymerizable epoxy group is a compound represented by the following formula (1):

$$\text{R}_C\text{—Si(Y)}_b\text{X}_{(3-b)} \tag{1}$$

wherein $R_C$ represents a non-hydrolyzable substituent having a cationically polymerizable epoxy group, X represents a hydrolyzable substituent, Y represents a non-hydrolyzable substituent, and b is an integer of 0 to 2.

5. The process for producing a liquid ejection head according to claim 1, wherein a proportion of the number of moles of the hydrolyzable silane compound having a cationically polymerizable epoxy group with respect to the total number of moles of the hydrolyzable silane compounds for use in step 2) is 10 to 90 mol %.

6. The process for producing a liquid ejection head according to claim 1, wherein the hydrolyzable silane compound having a fluorine-containing group is a compound represented by the following formula (2):

$$\text{R}_f\text{—Si(Y)}_b\text{X}_{(3-b)} \tag{2}$$

wherein $R_f$ represents a non-hydrolyzable substituent having a fluorine atom bonded to a carbon atom, X represents a hydrolyzable substituent, Y represents a non-hydrolyzable substituent, and b is an integer of 0 to 2.

7. The process for producing a liquid ejection head according to claim 6, wherein $R_f$ in the formula (2) has 3 to 35 fluorine atoms bonded to carbon atoms.

8. The process for producing a liquid ejection head according to claim 1, wherein a proportion of the number of moles of the hydrolyzable silane compound having a fluorine-containing group with respect to the total number of moles of the hydrolyzable silane compounds for use in step 2) is to 20 mol %.

9. The process for producing a liquid ejection head according to claim 1, wherein the hydrolyzable silane compounds in step 2) further comprises a hydrolyzable silane compound represented by the following formula (4):

$$\text{R}_{da}\text{—SiX}_{(4-a)} \tag{4}$$

wherein $R_d$ represents an alkyl group, X represents a hydrolyzable substituent, and a is an integer of 1 to 3.

10. The process for producing a liquid ejection head according to claim 1, wherein the condensation product has a condensation degree of 20 to 80%.

11. The process for producing a liquid ejection head according to claim 1, wherein the photocationically polymerizable resin material is an epoxy compound.

* * * * *